United States Patent
Hayashi

(10) Patent No.: US 8,487,708 B2
(45) Date of Patent: Jul. 16, 2013

(54) CLOCK OSCILLATOR CIRCUIT AND SEMICONDUCTOR DEVICE

(75) Inventor: Isamu Hayashi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 74 days.

(21) Appl. No.: 13/286,208

(22) Filed: Oct. 31, 2011

(65) Prior Publication Data

US 2012/0112841 A1    May 10, 2012

(30) Foreign Application Priority Data

Nov. 5, 2010    (JP) .................. 2010-248241

(51) Int. Cl.
*H03K 3/03*    (2006.01)
(52) U.S. Cl.
USPC ............. 331/57; 331/2; 331/45; 331/1 A; 327/156; 327/159
(58) Field of Classification Search
USPC ............. 331/45, 57, 2, 1 A; 327/156, 159
See application file for complete search history.

(56) References Cited

U.S. PATENT DOCUMENTS 8,138,843 B2 *    3/2012    Straayer et al. ............... 331/57
8,294,525 B2 *    10/2012    Bulzacchelli et al. ......... 331/57

OTHER PUBLICATIONS

John G. Maneatis et al., "Precise Delay Generation Using Coupled Oscillators", IEEE Journal of Solid-State Circuits, vol. 28, No. 12, Dec. 1993, pp. 1273-1282.

* cited by examiner

*Primary Examiner* — Arnold Kinkead
(74) *Attorney, Agent, or Firm* — Miles & Stockbridge P.C.

(57) ABSTRACT

An object is to provide a method for preventing the occurrence of variations in time resolution by providing a calibration process to a TDC at the time of start up and further preventing the increase in circuit scale by reducing the redundancy of delay elements. A calibration of a multiphase oscillator TDC and a vernier TDC is carried out at the time of power-on. In the calibration, a timing input to be input to the vernier TDC is selected from output signals of DCCO based on a reference clock. Also, data is defined as an output signal which is adjacent to the output signal of DCCO mentioned above and proceeds in phase, and the delay therebetween is derived. By repeating it to all of the output signals, the one cycle of the output signal of DCCO is derived.

11 Claims, 10 Drawing Sheets

CLOCK OSCILLATOR CIRCUIT AND SEMICONDUCTOR DEVICE

CROSS-REFERENCE TO RELATED APPLICATIONS

The present application claims priority from Japanese Patent Application No. 2010-248241 filed on Nov. 5, 2010, the content of which is hereby incorporated by reference to this application.

TECHNICAL FIELD

The present invention relates to a time to digital converter (TDC) used for an all-digital phase-locked loop (ADPLL) and more particularly to calibration thereof.

BACKGROUND

A TDC is a circuit which converts a time component into a digital value. In a conventional digital circuit, time has been handled based on clock cycle. On the other hand, in a TDC, an element delay amount is extracted with clock timing, and thus time can be measured with reference to the delay amount of respective elements. In this manner, the time component with higher resolution than ever before can be handled as a digital value.

In general, it is difficult to realize a TDC capable of achieving both the high time resolution and the adaptation to a wide frequency range. Also, from the relation of being dependent on the delay inherent to an element, the TDC has a disadvantage of being affected by the change in delay value due to the variation in PVT (manufacturing process, power supply voltage and temperature). More specifically, the delay value ratio varies depending on frequency due to the change in delay value. As a result, the time resolution of the TDC becomes nonconstant, and it becomes necessary to make a correction according to situations or to prepare a number of elements with a certain level of margin.

PRIOR ART DOCUMENTS

Non-Patent Documents

Precise Delay Generation Using Coupled Oscillators IEEE JOURNAL OF SOLID-STATE CIRCUITS, VOL. 28, NO. 12, December 1993

SUMMARY

An object of the present invention is to provide a method for preventing the occurrence of variations in time resolution by providing a calibration process to a TDC at the time of start up or in the background in normal time and further preventing the increase in circuit scale by reducing the redundancy of delay elements.

The above and other objects and novel characteristics of the present invention will be apparent from the description of the present specification and the accompanying drawings.

The following is a brief description of an outline of the typical invention disclosed in the present application.

An ADPLL according to a typical embodiment of the present invention includes: a DCCO (Digital-Controlled Coupled Oscillator) having a coupled oscillator and a digitally-controlled current source which supplies a current to the coupled oscillator; and a digital control unit which controls a current value output from the digitally-controlled current source.

This ADPLL may be characterized in that the current value output from the digitally-controlled current source is controlled by a current mirror circuit.

This ADPLL may be characterized in that the current value output from the digitally-controlled current source is controlled by switching an output-side amplifier of the current mirror circuit.

This ADPLL may be characterized in that the current value output from the digitally-controlled current source is controlled by changing a current input to the current mirror circuit.

Another ADPLL according to a typical embodiment of the present invention includes: a DCCO having a coupled oscillator and a digitally-controlled current source which supplies a current to the coupled oscillator; a counter which counts outputs of the DCCO with a resolution based on an input reference clock; a circuit which samples multiphase clock outputs of the DCCO at the reference clock; a vernier time to digital converter which latches a delay amount between other phase clock outputs of the DCCO at a clock selected from the reference clock and the multiphase clock output of the DCCO; and a digital control unit which controls a current value output from the digitally-controlled power source, and variations in phase difference between multiphase clock outputs of the DCCO are measured and corrected by the vernier time to digital converter, whereby the digital control unit carries out the calibration.

This ADPLL may be characterized in that two or more ring oscillators having a plurality of 2-input delay buffers are connected in multiple stages in the DCCO and approximately equal waveforms with different delay amounts are output by the outputs of the plurality of 2-input delay buffers included in the two or more ring oscillators.

This ADPLL may be characterized in that a phase difference between adjacent clocks is derived by using the outputs of the DCCO having the smallest difference in delay amount and the digital control unit obtains one clock cycle output from the DCCO by accumulating the phase differences between each of the outputs of the DCCO.

This ADPLL may be characterized in that the digital control unit derives an ideal phase difference between adjacent clocks by dividing the one clock cycle by the number of outputs of the DCCO and the digital control unit carries out the calibration based on it.

A semiconductor device characterized by including these ADPLLs is also included in the scope of the present invention.

The use of the present invention makes it possible to realize a phase to digital converter having a constant time resolution ratio even when the clock cycle and the PVT (manufacturing process, power supply voltage and temperature) vary.

DETAILED DESCRIPTION

In the embodiment described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiment described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiment described below, it goes without saying that the components are not always indispensable unless otherwise stated or except the case where the components are apparently indispensable in principle. Also, the circuit elements constituting each functional block of the embodiment are not particularly limited, but are formed on a semiconductor substrate such as that made of single crystal silicon by the integrated circuit technology of CMOS (complementary MOS transistor) and others. When a MOSFET (Metal Oxide Semiconductor Field Effect Transistor or MOSFET transistor) is described in the embodiment, a non-oxide film is not excluded as a gate insulating film.

Furthermore, when TDC (Time to Digital Converter or Phase to Digital Converter) is described, the difference is whether time information is handled as an actual time or as a phase to frequency, and they are the same in terms of the function to convert a time component to a digital value.

Hereinafter, an embodiment of the present invention will be described with reference to drawings.

First Embodiment

Figure 1:
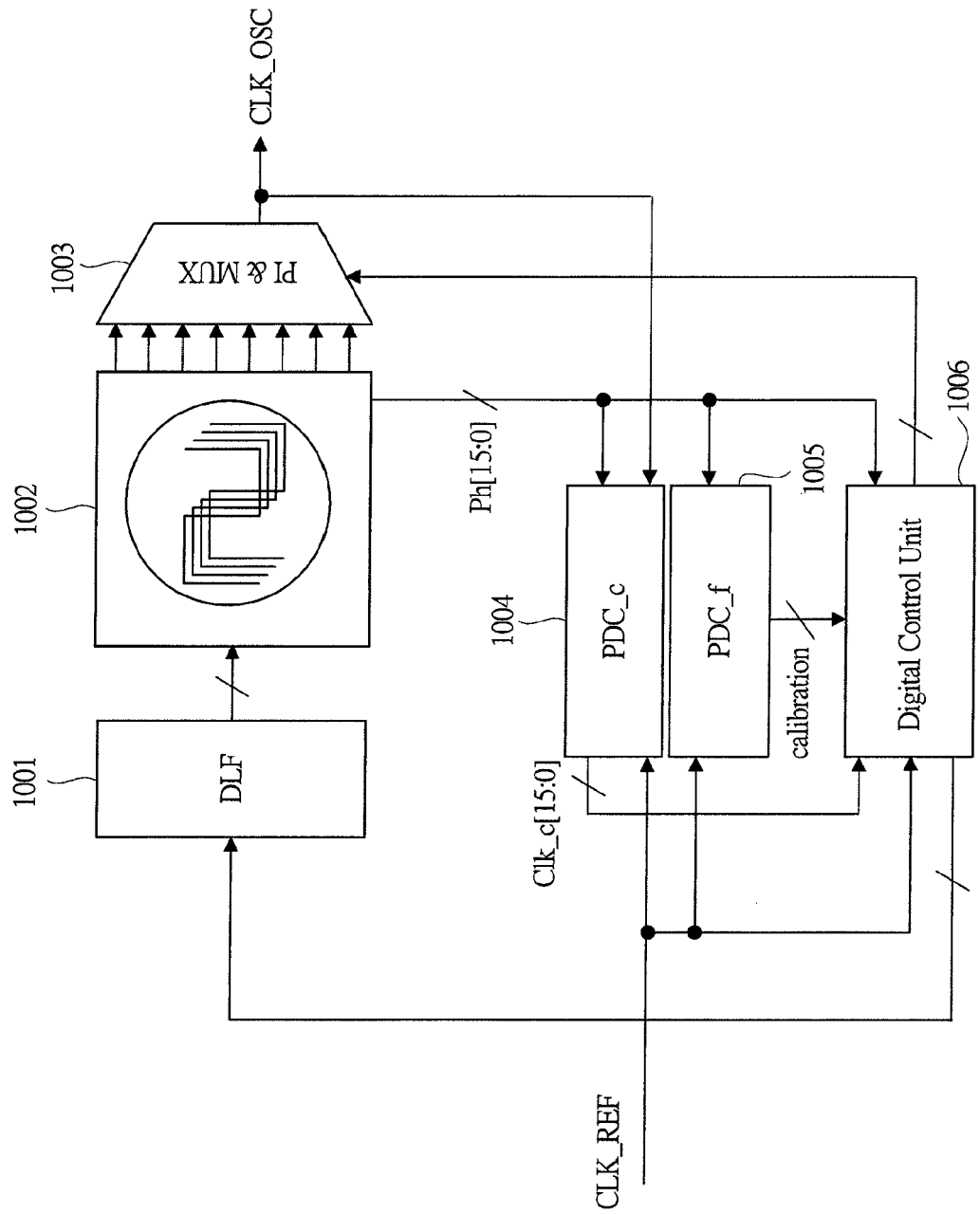
FIG. 1 is a block diagram showing the configuration of the clock oscillator circuit using the ADPLL according to the present invention.

FIG. 1 is a block diagram showing a configuration of a clock oscillator circuit using an ADPLL (All-Digital Phase-Locked Loop) according to the present invention.

This ADPLL is configured by including a DLF 1001, a DCCO 1002, a PI&MUX 1003, a PDC_c 1004, a PDC_f 1005 and a digital control unit 1006.

The DCCO (Digital-Controlled Coupled Oscillator) 1002 is made up of a coupled oscillator 1002A whose oscillation frequency can be changed by a control signal transmitted through the DLF (Digital Lowpass Filter) 1001 and a digitally-controlled current source 1002B.

The PI&MUX 1003 is a multiplexer circuit which selects which of signals output from the DCCO 1002 as an output of the ADPLL.

The PDC_c (Phase to Digital Converter_Coarse) 1004 is a "coarse" phase to digital converter circuit which latches the output of the DCCO 1002 by a reference frequency.

The PDC_f (Phase to Digital Converter_fine) 1005 is a vernier time to digital converter for detecting a finer value than the reference frequency by a buffer delay.

The digital control unit 1006 is a controller which controls the DCCO 1002 with reference to the outputs of the DCCO 1002 and the PDC_c 1004.

Figure 2:
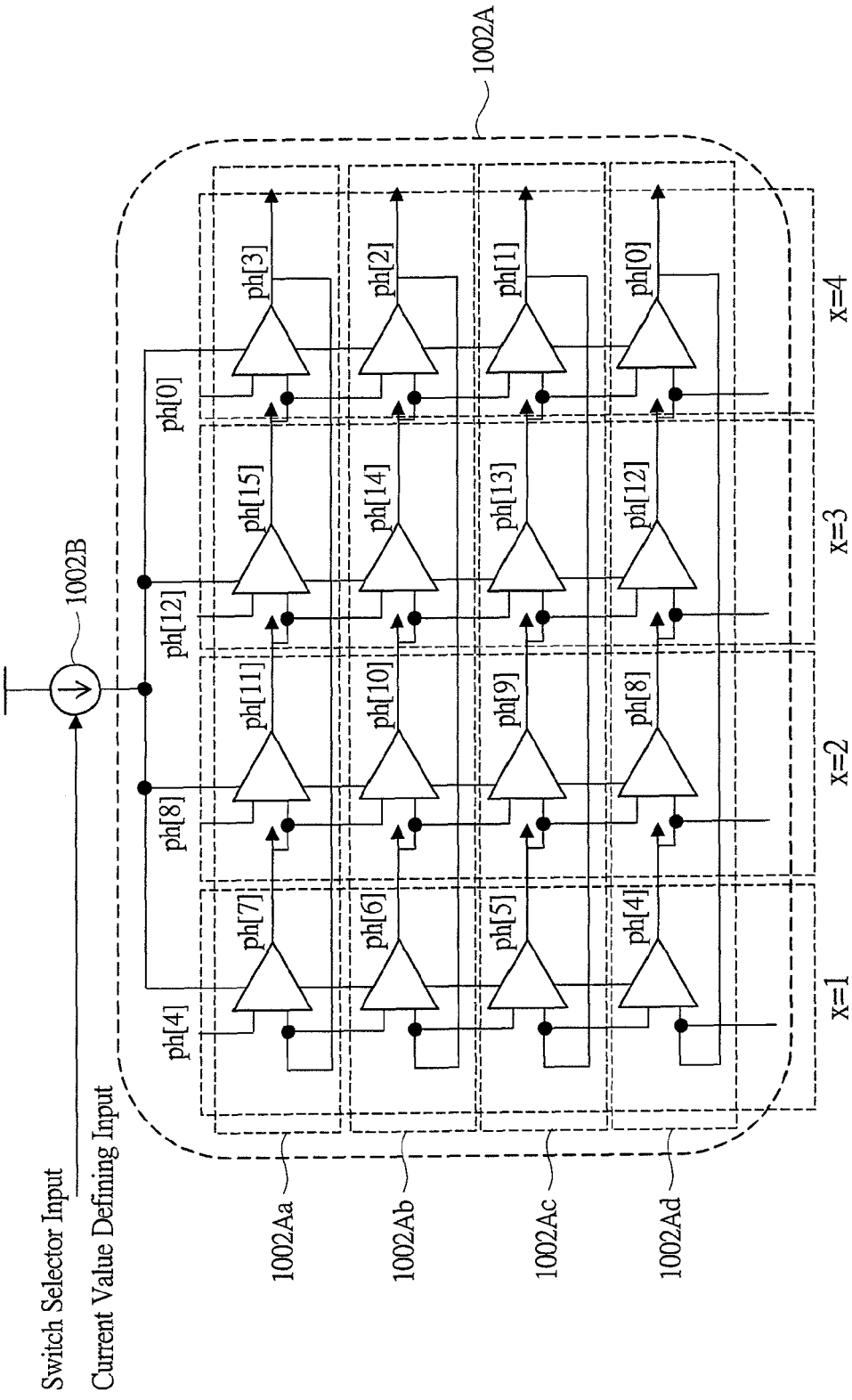
FIG. 2 is a schematic diagram showing the configuration of the DCCO according to the present invention.

FIG. 2 is a schematic diagram showing the configuration of the DCCO 1002 according to the present invention.

When roughly classified, the DCCO 1002 is configured by including the coupled oscillator 1002A and the digitally-controlled current source 1002B.

The coupled oscillator 1002A is an array oscillator obtained by coupling a plurality of ring oscillators. In this manner, it is possible to output a plurality of phase clock signals with a time resolution higher than the delay time corresponding to one stage of delay element configured of a ring oscillator.

This coupled oscillator 1002A has a configuration in which ring oscillators are arranged in four stages.

Figure 3:
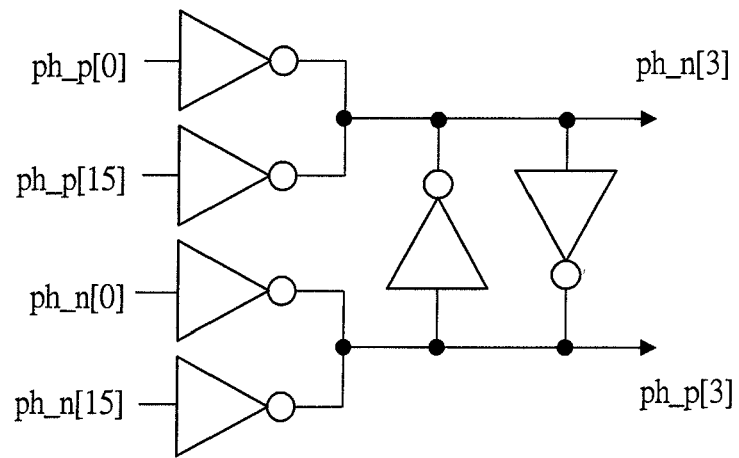
FIG. 3 is a circuit diagram showing the configuration of a differential 2-input buffer used in a ring oscillator.

These ring oscillators 1002Aa, 1002Ab, 1002Ac and 1002Ad each include four 2-input buffers as delay elements. Each of the 2-input buffers has two input terminals including one input terminal which receives a signal from a former stage of the same ring buffer and the other input terminal which receives a corresponding output signal of a different ring buffer. FIG. 3 is a circuit diagram showing a configuration of a differential 2-input buffer used in these ring oscillators.

The 2-input buffer of this diagram is described based on the assumption of x=4 of the ring oscillator 1002Aa. Therefore, the input signals and the output signals are also those at the corresponding places.

The 2-input buffer is assumed to operate as a differential type. Thus, the ring oscillator can operate even if it is configured of an even number of buffers.

Figure 4:
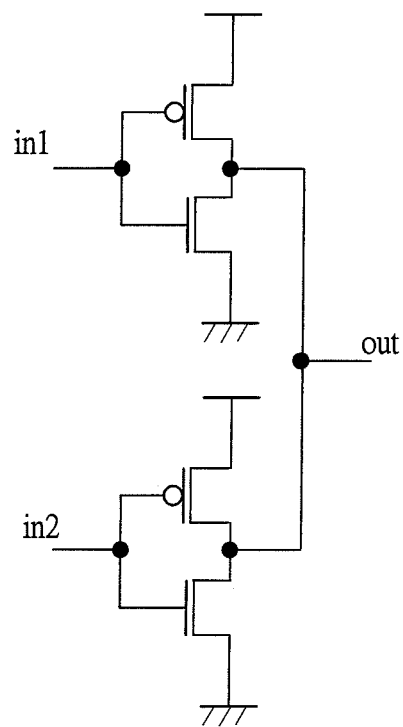
FIG. 4 is a circuit diagram showing the configuration of a single-phase 2-input buffer.

FIG. 4 is a circuit diagram showing the configuration of a single-phase 2-input buffer. Of course, the invention can be embodied even when the single-phase 2-input buffer is used. In this case, however, the number of 2-input buffers constituting each ring oscillator has to be an odd number. In the following description, the ring oscillator shall be configured of differential-type 2-input buffers.

The 2-input buffers of these ring oscillators 1002Aa, 1002Ab, 1002Ac and 1002Ad have their high order and low order determined thereto, and are connected to the 2-input buffers of the corresponding other ring oscillators. The following correspondence relation is provided in the diagram.

Ring oscillator 1002Aa
High order: ring oscillator 1002Ad
Low order: ring oscillator 1002Ab
Ring oscillator 1002Ab
High order: ring oscillator 1002Aa
Low order: ring oscillator 1002Ac
Ring oscillator 1002Ac
High order: ring oscillator 1002Ab
Low order: ring oscillator 1002Ad
Ring oscillator 1002Ad
High order: ring oscillator 1002Ac
Low order: ring oscillator 1002Aa

Then, the output of the x−1-th (x=1, 2, 3, 4) 2-input buffer of the high-order ring oscillator becomes the input of the x-th 2-input buffer of the ring oscillator. Furthermore, the output of the x-th 2-input buffer of that ring oscillator becomes the input of the x+1-th 2-input buffer of the low-order ring oscillator. For example, an output ph[7] of the 2-input buffer at x=1 of the ring oscillator 1002Aa is output not only to the 2-input buffer at x=2 of the same ring oscillator but also to the 2-input buffer at x=2 of the low-order ring oscillator 1002Ab.

With the configuration described above, control is performed using the output of the corresponding input buffer of the high-order ring oscillator, and therefore, it is possible to prevent the occurrence of the noise on the ring oscillator operated at a high frequency.

The digitally-controlled current source 1002B is a variable current source which controls a current to be supplied to the coupled oscillator 1002A based on a control signal transmitted from the digital control unit 1006.

Figure 5:
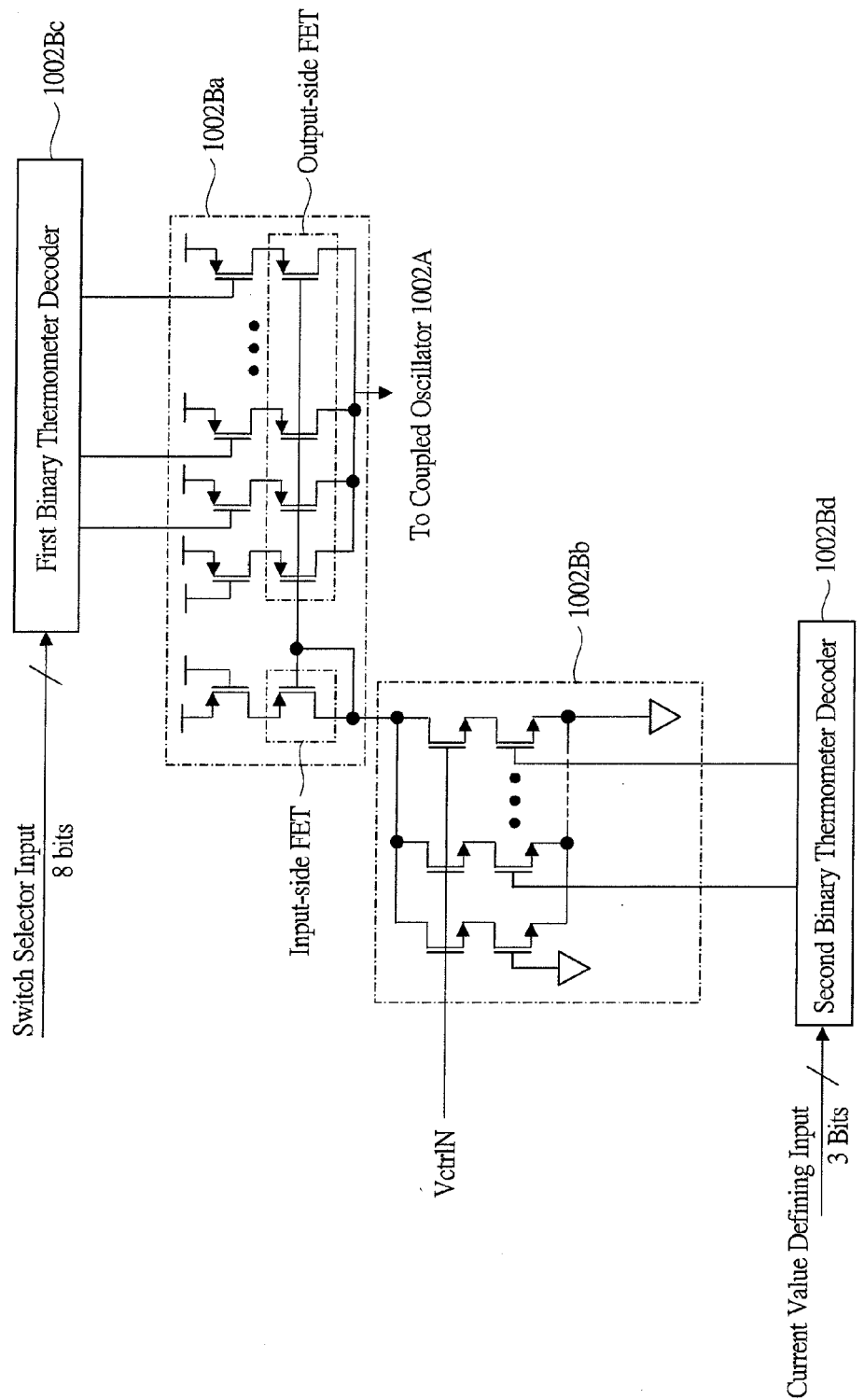
FIG. 5 is a circuit diagram showing the detail of a digitally-controlled current source.

FIG. 5 is a circuit diagram showing the detail of the digitally-controlled current source 1002B.

A switch selector input of 8 bits and a current value defining input of 3 bits are input to the digitally-controlled current source 1002B. The digitally-controlled current source 1002B is configured by including a current mirror switch unit 1002Ba, a reference current generating unit 1002Bb, a first binary thermometer decoder 1002Bc and a second binary thermometer decoder 1002Bd.

The current mirror switch unit 1002Ba is a switch unit made up of a current mirror circuit. This current mirror switch unit 1002Ba is configured by including one input-side FET and 255 output-side FETs. These output-side FETs have respectively different amplification factors, and the value of the current to be supplied to the coupled oscillator 1002A is determined by the balance between these output-side FETs and the input-side FET.

The first binary thermometer decoder 1002Bc is a decoder which generates a control signal for controlling a gate terminal of the output-side FET of the current mirror switch unit 1002Ba.

Note that the reason why the number of output-side FETs in the current mirror switch unit 1002Ba is 255 is that the switch selector input is 8 bits. If the switch selector input can have a width of more than 8 bits, more number of FETs may be used. Also, if such a number of FETs are not required, the number of signal lines of the switch selector input may be reduced.

The reference current generating unit 1002Bb is a circuit which controls a current value flowing to the input-side FET of the digitally-controlled current source 1002B. On this side, the switch selection is performed by changing how many FETs arranged in parallel are activated, thereby performing the above-described control of the current value.

It is the output from the second binary thermometer decoder 1002Bd that controls the reference current generating unit 1002Bb. The second binary thermometer decoder 1002Bd determines, by the current value defining input of 3 bits to be input, which of the FETs in the reference current generating unit 1002Bb is turned ON.

The switch selector input and the current value defining input are input from the digital control unit 1006 through the DLF 1001.

In an example of a method for using the switch selector input and the current value defining input, the current value defining input may be set at the time of startup and the switch selector input only may be changed during the actual operation. However, the method is not limited to this.

Figure 6:
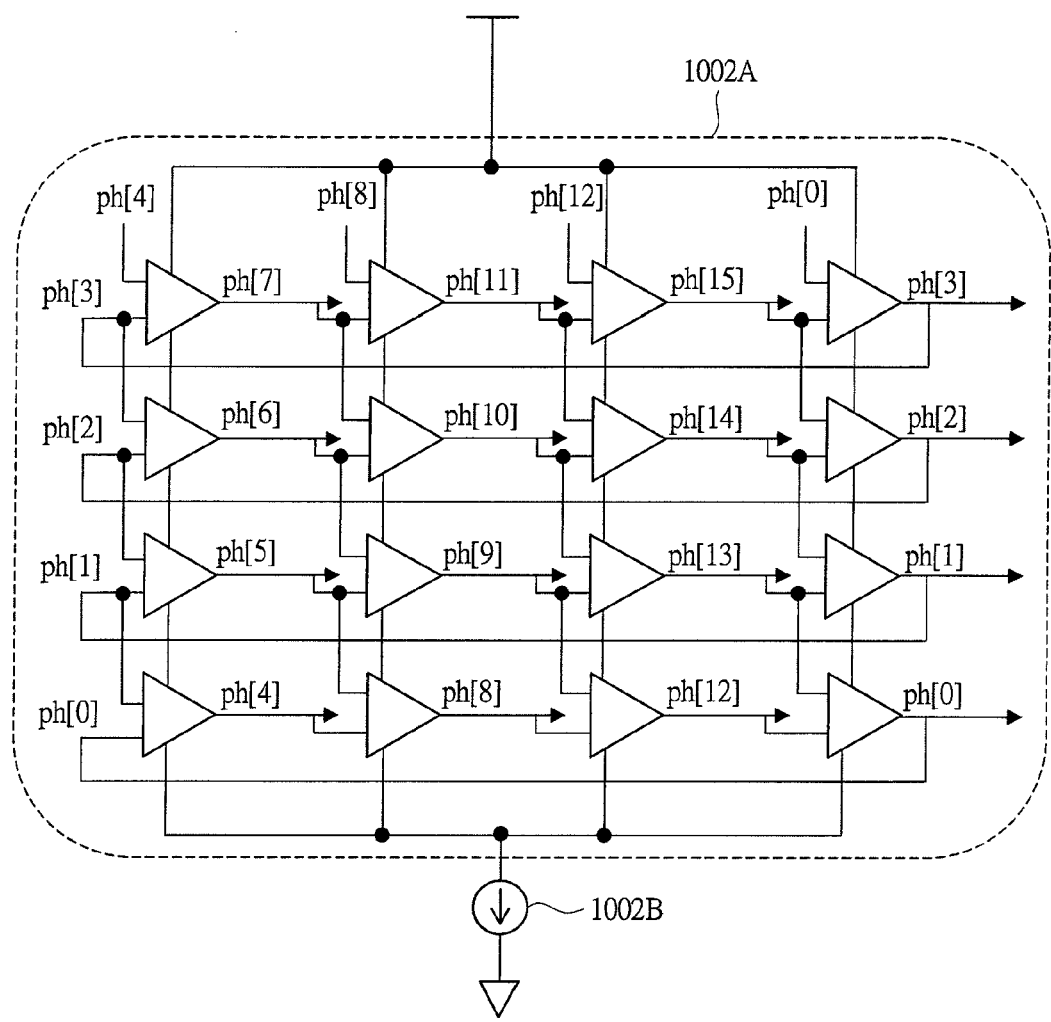
FIG. 6 is a schematic diagram showing the configuration of the DCCO according to the present invention designed to change the current on an output side.

Also, although the current on the input side is changed in FIG. 2, it is also possible to change the current on the output side. FIG. 6 is a schematic diagram showing the configuration of the DCCO 1002 according to the present invention designed to change the current on the output side.

Figure 7:
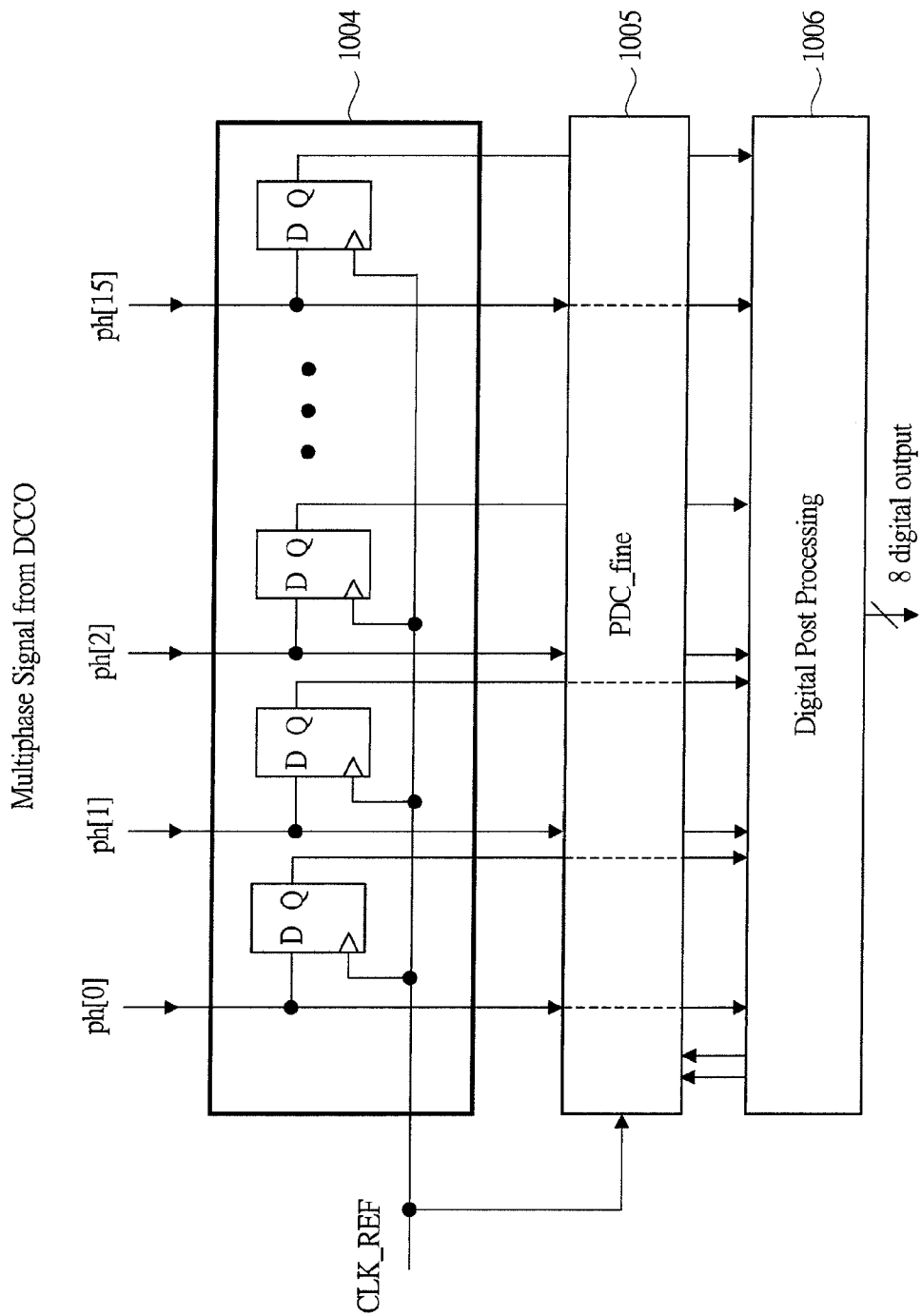
FIG. 7 is a circuit diagram showing the inner configuration of the PDC_c.

Next, the configuration of the PDC_c 1004 will be described. FIG. 7 is a circuit diagram showing the inner configuration of the PDC_c 1004.

The ph[15:0] which is an output of the coupled oscillator 1002A in the DCCO 1002 is input as data to the PDC_c 1004. This ph[15:0] is latched by a sampling circuit in the PDC_c 1004 or D-FF in the diagram at the rising timing of the reference clock CLK_REF. The sampling circuit is not limited to D-FF and may be RS-FF or a half latch. In this manner, the operation clock can be adjusted with the time resolution which is one-sixteenth the reference clock CLK_REF.

Figure 9:
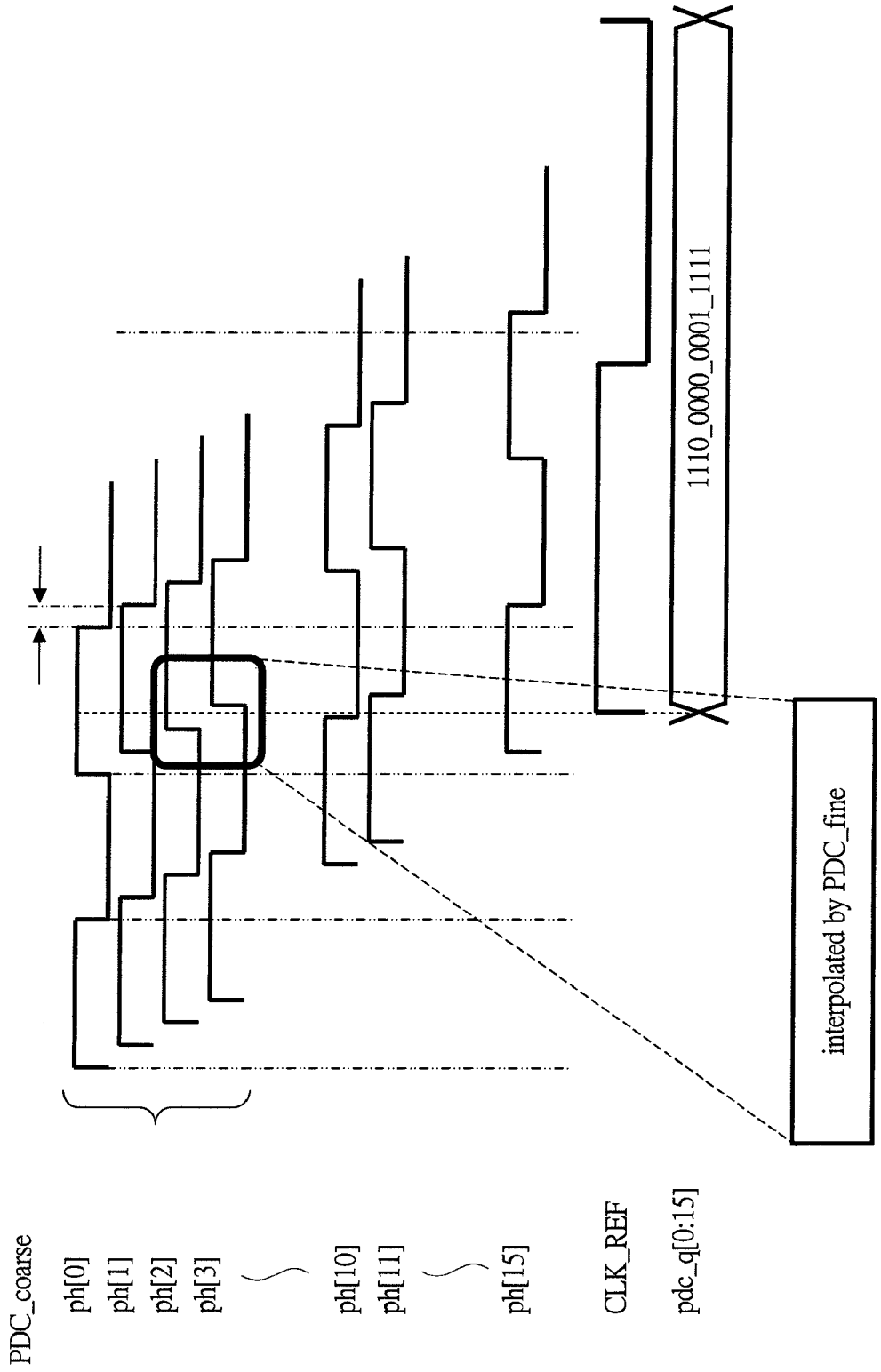
FIG. 9 is a waveform diagram showing the operation of the DCCO and the PDC_c.

FIG. 9 is a waveform diagram showing the operation of the above-described DCCO 1002 and the PDC_c 1004. As can be seen from this, the output of the DCCO 1002 is latched at the rising of the reference clock CLK_REF. This becomes a signal pdc_q[0:15] to be transmitted to the digital control unit 1006 as an output of the PDC_c 1004.

Figure 8:
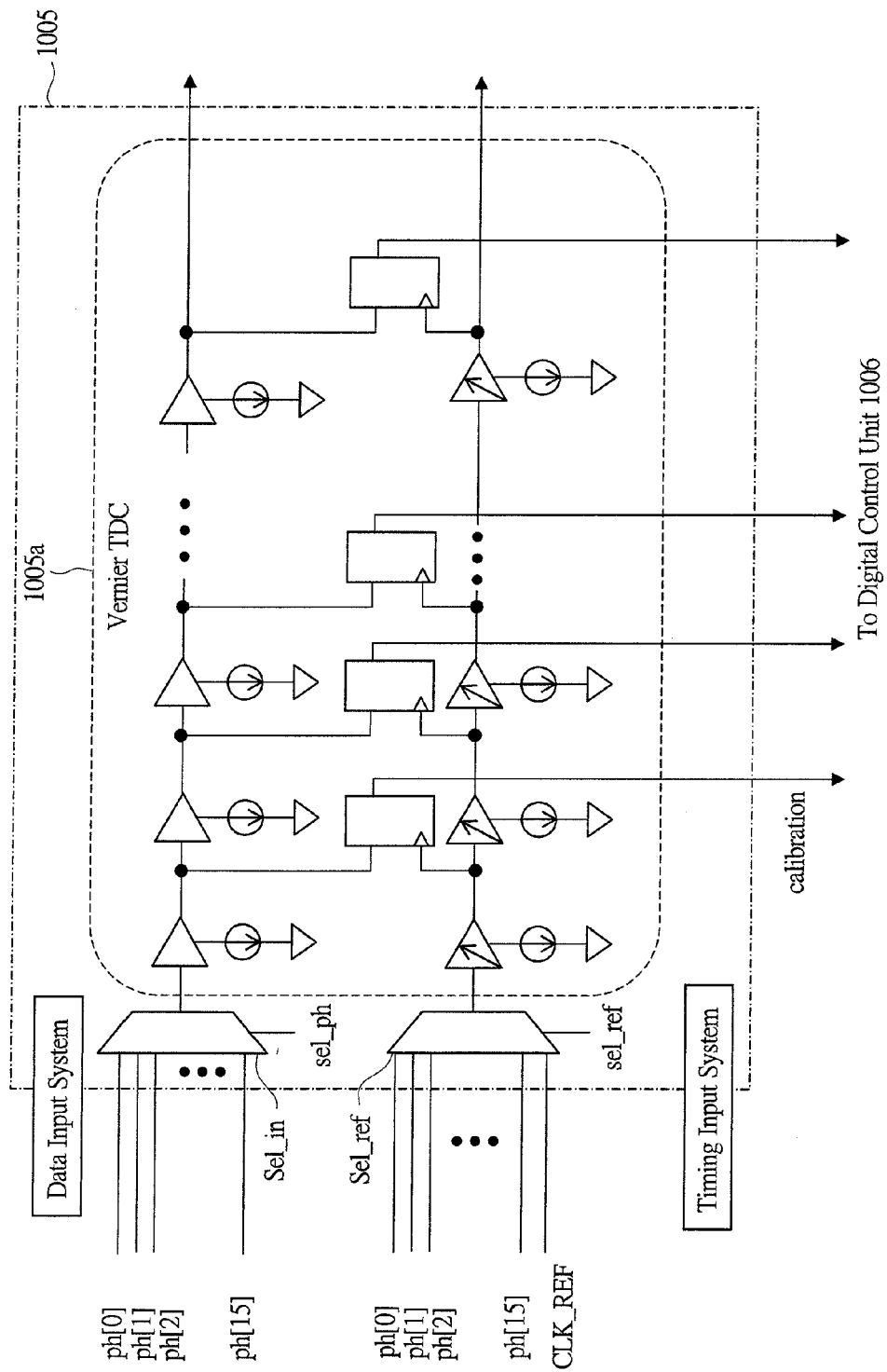
FIG. 8 is a circuit diagram showing the inner configuration of the PDC_f.

Next, the configuration of the PDC_f 1005 will be described. FIG. 8 is a circuit diagram showing the inner configuration of the PDC_f 1005. The PDC_f 1005 according to the present invention is characterized by having two modes of a calibration mode at the time of startup and a normal operation mode.

As described above, the PDC_f 1005 is configured by including the vernier time to digital convertor (VTDC) 1005a.

The VTDC (Vernier TDC) 1005a is made up of two delay cell chains having different delay values. One delay cell chain is used for measuring the delay of the input clock from the element delay of the buffer in the configuration. Each of the buffers is connected in series and the output of each buffer is connected to the data terminal of the corresponding D-FF. This delay cell chain is shown as "data input system" in FIG. 8.

This data input system has no difference from a general delay cell chain except that an input can be selected by the selector Sel_in.

Meanwhile, the other delay cell chain or "timing input system" in FIG. 8 directly relates to the above-described two modes.

The calibration mode is a mode for carrying out the calibration in the TDC. At the time of initialization such as power-on, the DCCO clock and the reference clock CLK_REF come to have the same frequency, and the calibration is then started. Alternatively, even in the normal operation, the calibration mode is carried out at regular intervals. The regular interval means the cycle in which the element delay due to the temperature change becomes remarkable and is, for example, every several seconds.

In the calibration mode, the phase difference information between adjacent clocks which differ by $2\pi/16$ is acquired. Specifically, ph[0] which is one of the outputs of the DCCO 1002 is selected as the data of the data input system. On the other hand, ph[1] is selected as the input of the timing input system. This is carried out by the selector Sel_ref of the "timing input system".

In this set state, the data terminal of the D-FF is latched and transmitted to the digital control unit 1006 as the information (=phase difference information) for calibration.

The adjacent clocks mentioned here are the outputs having the smallest phase difference based on a specific output (here ph[n]) of the DCCO 1002. There exist two adjacent clocks in the direction in which the phase progresses and in the direction in which it delays, and the clock ph[n] in which the phase delays by 2π/16 is set as timing and the clock ph[n−1] in which the phase progresses by 2π/16 is set as data.

In the drawings of this specification, this is repeatedly just 16 times (=number of outputs of DCCO 1002).

Specifically, when all of the pieces of phase difference information described above are added, it corresponds to one cycle of the DCCO clock. Therefore, the ideal phase difference Δph_ideal between the adjacent clocks after the calibration is the value obtained by dividing the above-described value obtained by adding all of the pieces of phase difference information by 16 (=number of outputs of DCCO 1002).

Figure 11:
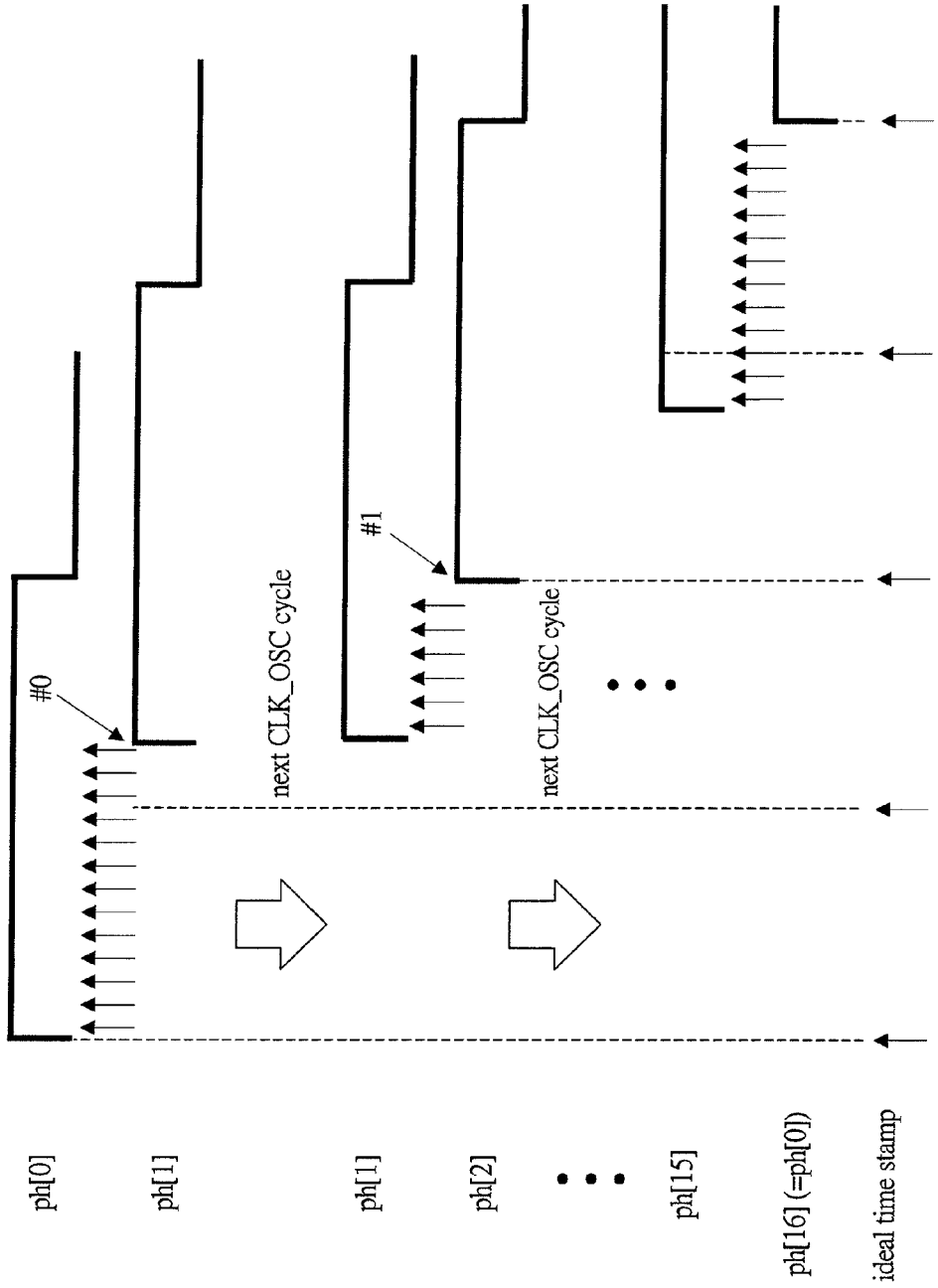
FIG. 11 is a conceptual diagram showing the operation of the PDC_f in the calibration mode.

FIG. 11 is a conceptual diagram showing the operation of the PDC_f 1005 in the calibration mode. This diagram indicates that the phase difference between ph[0] and ph[1] is obtained at #0 and the phase difference between ph[1] and ph[2] is obtained at #1 and the phase difference between ph[0] and ph[2] is obtained by adding the phase differences. This also indicates that one cycle of the DCCO clock can be obtained by adding all of 16 phase differences.

The value obtained by subtracting each ph[n] (n=0 to 15) from the ideal phase difference Δph_ideal between the adjacent clocks is the calibration value of the phase information.

The digital control unit 1006 controls the back bias of the timing input system based on these pieces of phase difference information and carries out the setting of the timing input system. Alternatively, it digitally corrects the phase information of ph[n].

The normal operation mode is a mode adopted in the normal operation using the ADPLL. At this time, the reference clock CLK_REF is selected as the timing of D-FF like in a normal operation.

Figure 10:
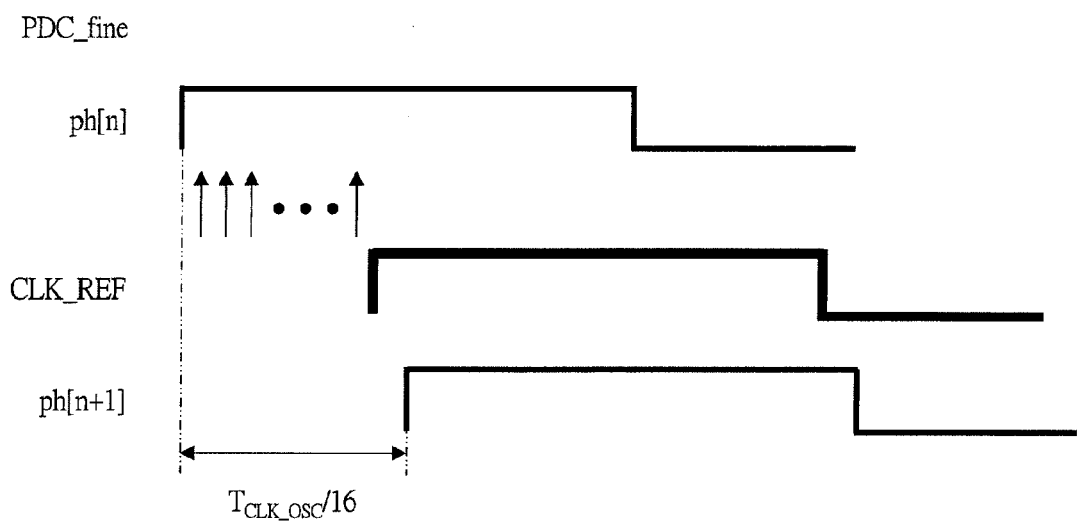
FIG. 10 is a conceptual diagram showing the operation of the PDC_f in the normal mode.

FIG. 10 is a conceptual diagram showing the operation of the PDC_f 1005 in the normal mode. The delay which is one-sixteenth the oscillation clock CLK_OSC can be measured by the PDC_c 1004. Therefore, it is possible to measure a finer delay than this value in the ADPLL.

By taking such measures described above, according to the first embodiment of the present invention, it is possible to realize a PDC having a constant time resolution ratio even when the clock cycle and the PVT vary, and it is also possible to realize a PDC having a time resolution higher than the delay time corresponding to one stage of a delay element.

In the foregoing, the invention made by the inventors of the present invention has been concretely described based on the embodiment. However, it is needless to say that the present invention is not limited to the foregoing embodiment and various modifications and alterations can be made within the scope of the present invention.

What is claimed is:

1. A clock oscillator circuit, comprising:
a coupled oscillator whose oscillation frequency is controlled by a control current and which is configured by including a plurality of coupled ring oscillators and outputs a plurality of phase clock signals;
a digitally-controlled current source which supplies the control current to the coupled oscillator;
a selection circuit to which the plurality of phase clock signals and a selection signal are input and which outputs a clock signal selected from the plurality of phase clock signals based on the selection signal;
a time to digital converter to which the selected clock signal and the plurality of phase clock signals are input and which converts a time component of the selected clock signal based on the plurality of phase clock signals to output a digital signal; and
a digital control unit which controls a current value of the control current output from the digitally-controlled current source based on the digital signal.

2. The clock oscillator circuit according to claim 1, wherein the current value output from the digitally-controlled current source is controlled by a current mirror circuit.

3. The clock oscillator circuit according to claim 2, wherein the current value output from the digitally-controlled current source is controlled by switching an output-side amplifier of the current mirror circuit.

4. The clock oscillator circuit according to claim 2, wherein the current value output from the digitally-controlled current source is controlled by changing a current input to the current mirror circuit.

5. A clock oscillator circuit, comprising:
a coupled oscillator whose oscillation frequency is controlled by a control current and which is configured by including a plurality of coupled ring oscillators and outputs a plurality of phase clock signals;
a digitally-controlled current source which supplies the control current to the coupled oscillator;
a time to digital converter to which a reference clock and the plurality of phase clock signals are input and which converts a time component of a selected clock signal based on the plurality of phase clock signals to output a digital signal; and
a digital control unit which controls a current value of the control current output from the digitally-controlled current source based on the digital signal,
wherein the digital control unit carries out a calibration by correcting a delay amount of a propagation path of the reference clock in the time to digital converter.

6. The clock oscillator circuit according to claim 5, wherein two or more ring oscillators having a plurality of 2-input delay buffers are connected in multiple stages in the coupled oscillator, and
approximately equal waveforms with different delay amounts are output by outputs of the plurality of 2-input delay buffers included in the two or more ring oscillators.

7. The clock oscillator circuit according to claim 6, wherein a phase difference between adjacent clocks is derived by using outputs of the ring oscillators having the smallest difference in delay amount, and the digital control unit obtains one cycle of a clock output from the ring oscillators by accumulating phase differences between outputs of the coupled oscillator.

8. The clock oscillator circuit according to claim 7, wherein the digital control unit derives an ideal phase difference between adjacent clocks by dividing the one cycle of a clock by the number of outputs of the coupled oscillator, and the digital control unit carries out the calibration based on it.

9. A semiconductor device comprising the clock oscillator circuit according to claim 1.

10. A semiconductor device comprising the clock oscillator circuit according to claim 5.

11. A semiconductor device comprising the clock oscillator circuit according to claim 8.

* * * * *